United States Patent
Andou et al.

(10) Patent No.: US 7,867,857 B2
(45) Date of Patent: Jan. 11, 2011

(54) TRANSISTOR AND METHOD FOR MANUFACTURING SAME

(75) Inventors: Takayoshi Andou, Kawasaki (JP); Kenya Kobayashi, Kawasaki (JP)

(73) Assignee: Renesas Electronics Corporation, Kanagawa (JP)

(*) Notice: Subject to any disclaimer, the term of this patent is extended or adjusted under 35 U.S.C. 154(b) by 514 days.

(21) Appl. No.: 11/936,106

(22) Filed: Nov. 7, 2007

(65) Prior Publication Data

US 2008/0111168 A1 May 15, 2008

(30) Foreign Application Priority Data

Nov. 9, 2006 (JP) .............................. 2006-304232

(51) Int. Cl.
*H01L 21/332* (2006.01)

(52) U.S. Cl. ................ 438/272; 438/135; 257/E21.382

(58) Field of Classification Search ................ 438/272, 438/268, 270, 156, 212, 135–138, 133
See application file for complete search history.

(56) References Cited

U.S. PATENT DOCUMENTS 6,174,773 B1 * 1/2001 Fujishima ................... 438/270

FOREIGN PATENT DOCUMENTS

JP 5-335582 12/1993

\* cited by examiner

*Primary Examiner*—Charles D Garber
*Assistant Examiner*—Reema Patel
(74) *Attorney, Agent, or Firm*—Young & Thompson

(57) ABSTRACT

An improved coupling stability between the source region and the source electrode of the transistor is achieved. In the method for manufacturing the MOSFET, the p-type base region is formed in a semiconductor layer, and after the p-type base region is formed in the surface portion of the n+ type source region, the higher concentration source region extending from the side edge of the n+ type source region to the lateral side of the n+ type source region is formed in the surface portion of the p-type base region. Then, the source electrode coupled to the higher concentration source region is formed. This allows providing an improved coupling stability between the source electrode and the source region when a misalignment is occurred in the location for forming the source electrode during the formation of the source electrode to be coupled to the first source region.

14 Claims, 11 Drawing Sheets

TRANSISTOR AND METHOD FOR MANUFACTURING SAME

This application is based on Japanese patent application No. 2006-304232, the content of which is incorporated hereinto by reference.

BACKGROUND

1. Technical Field

The present invention relates to a transistor and a method for manufacturing thereof, and in particular relates to a vertical metal oxide semiconductor field effect transistor (vertical MOSFET) and a method for manufacturing thereof.

2. Related Art

A typical conventional technology for a vertical MOSFET includes a configuration described in Japanese Patent Laid-Open No. H05-335582 (1993). FIG. 6 is a diagram, showing a transistor of a related art having a cross-sectional configuration similar to that of a MOSFET disclosed in Japanese Patent Laid-Open No. H05-335582. In FIG. 7, a plan view of the transistor of the related art that is manufactured using a similar process disclosed in Japanese Patent Laid-Open No. H05-335582 is shown. FIG. 6 is a cross-sectional view along line A-A' of FIG. 7.

A transistor shown in FIG. 6 and FIG. 7 is manufactured by the following procedure. FIGS. 8A and 8B, FIGS. 9A and 9B and FIG. 10 are cross-sectional views, showing a process for manufacturing the transistor shown in FIG. 6 and FIG. 7.

First of all, as shown in FIG. 8A, a gate trench 202 is formed in a semiconductor substrate 201. More specifically, the formation of the gate trench is carried out via a selective etching process utilizing a photolithographic technology. Next, a gate oxide film 203 is formed on the entire surface thereof via a thermal oxidation process. Subsequently, a polysilicon film 204 for forming a gate electrode is formed via a chemical vapor deposition (CVD) on the entire surface thereof (FIG. 8B). Then, an etching process is conducted for such polysilicon film 204, so that the polysilicon film 204 partially remains in the gate trench 202 (FIG. 9A).

Subsequently, a p-type base region 205 for active cell is formed via an ion implantation with boron and a thermal processing, and a mask having openings that serve as regions for forming p+ type base regions 209 is formed via a patterning process of a photolithographic technology, and then an ion implantation of borondifluoride (BF$_2$) and a thermal processing are conducted through the openings to selectively form the P+ type base regions 209 in a predetermined locations. Next, a mask having openings that serve as regions for forming n+ type source regions 206 is formed via a patterning process of a photolithographic technology, and then an ion implantation of arsenic and a thermal processing are conducted through the openings to selectively form the n+ type source regions 206 in predetermined locations (FIG. 9B).

Next, a boro-phospho silicate glass (BPSG) film is formed via a CVD process to form an interlayer insulating film 207, and then predetermined locations of the BPSG are selectively removed via a photolithographic technology and an etching process (FIG. 10). Next, a barrier metal film 210 is formed on the surface thereof via a sputter process, and subsequently, a sputter process of aluminum is conducted to form a source electrode 212. The MOSFET shown in FIG. 6 is thus obtained by the above-mentioned procedure.

However, the present inventors discovered that there are needs to be improved in the vertical MOSFET of the related art in view of the following aspects. A specific description of the above-described needs will be described in reference to the above-described constitutions shown in FIG. 6.

In the device shown in FIG. 6, since the source regions are formed by employing a mask in the manufacturing process (FIG. 10), as shown in FIG. 11, misalignment of the patterned mask may cause a decreased area of a source contact. Thus, this could increase the source contact resistance.

In the structure including the contact of the source contact in the cell unit of the MOS transistor with the source electrode as described above as a two-dimensional pattern obtained by forming the source region by using a mask, a reduced dimensional area of the source contact due to misalignment of the patterned mask may cause an increased source contact resistance. An increased source contact resistance causes an increased on-resistance of the MOS transistor, leading to decreased properties thereof. Thus, it is required that the source electrode is electrically coupled to source region in a stable condition.

SUMMARY

According to one aspect of the present invention, there is provided a method for manufacturing a transistor, comprising: forming, in a semiconductor layer having a first conductivity type, a base region having a second conductivity type; forming a first source region having the first conductivity type in the base region; forming a second source region having the first conductivity type in the base region, wherein the second source region is in contact with the first source region; and forming a source electrode coupled to both the second source region and the base region According to another aspect of the present invention, there is provided a transistor, comprising: a semiconductor layer having a first conductivity type; a base region having a second conductivity type provided in a surface portion of the semiconductor layer, wherein the second conductivity type is inverse to the first conductivity type; a gate electrode formed in a trenched portion that is provided in the base region; a first source region having the first conductivity type provided in the lateral side of the gate electrode and provided in a surface portion of the base region; a second source region having the first conductivity type provided in the surface portion of the base region and in contact with the first source region; and a source electrode coupled to the second source region In the present invention, the second source region extending from a side edge of the first source region to a lateral side of the first source region is formed. The second source region may be shallower than the first source region. The source electrode coupled to the second source region is formed. This allows providing an improved coupling stability between the source electrode and the source region. For example, when a misalignment is occurred in the location for forming the source electrode during the formation of the source electrode to be coupled to the first source region in the process for manufacturing the transistor, a stable coupling between the source region and the source electrode can be assured if the second source region extending to the lateral side of the first source region is formed.

In addition to above, arbitrary combinations of the above-mentioned components, or conversions of the components and the expression related to the present invention between the method and the apparatus or the like may also effectively constitute the aspect of the present invention.

As described above, according to the present invention, an improved coupling stability between the source region and the source electrode of the transistor can be achieved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will now be described herein with reference to illustrative embodiments. Those skilled in the art will recognize that many alternative embodiments can be accomplished using the teachings of the present invention and that the invention is not limited to the embodiments illustrated for explanatory purposed.

Preferable exemplary implementations according to the present invention will be described in reference to the annexed figures. In all figures, identical numeral is assigned to an element commonly appeared in the description of the present invention in reference to the figures, and the detailed description thereof will not be repeated.

Figure 1:
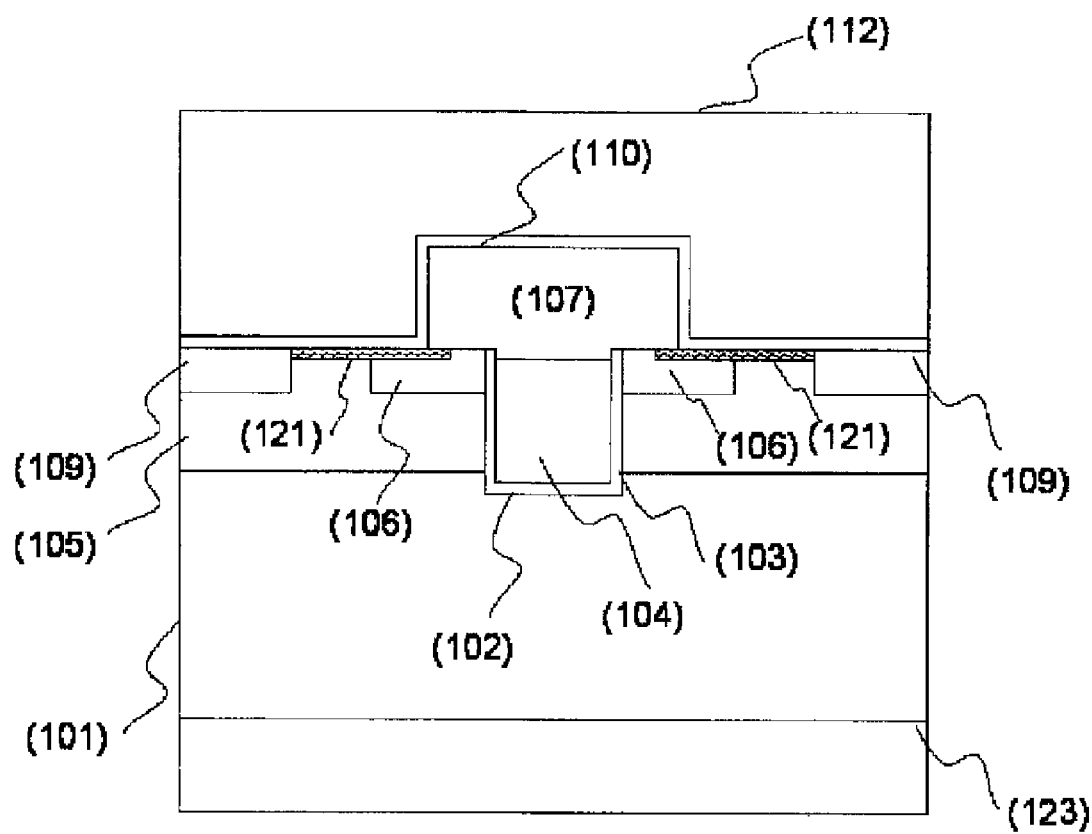
FIG. 1 is a cross-sectional view, showing a configuration of a transistor in an embodiment.
Figure 2:
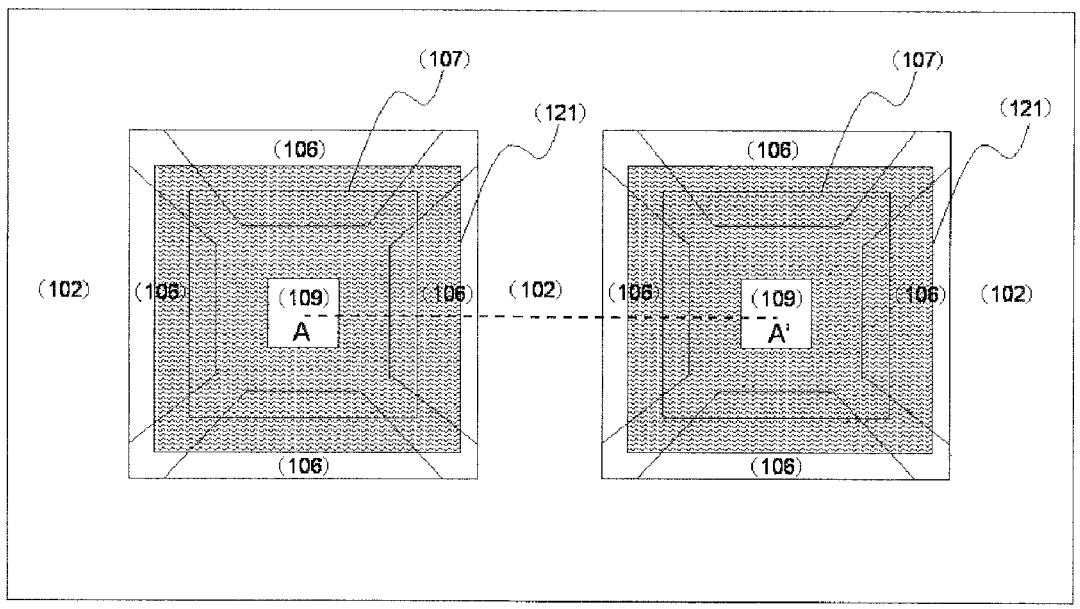
FIG. 2 is a plan view, showing the configuration of the transistor in the embodiment.

FIG. 1 and FIG. 2 are diagrams, showing a constitution of an n-channel vertical MOSFET of the present embodiment. FIG. 1 is a cross-sectional view along line A-A' of FIG. 2, showing a cross-sectional structure of a cell unit of a source-two dimensional-contact structure in the n-channel vertical MOSFET.

A MOSFET 100 shown in FIG. 1 and FIG. 2 is a vertical MOSFET having a configuration, in which an upper surface of a source region provided in a semiconductor substrate is in contact with a source electrode. The MOSFET 100 is also configured to have a higher concentration source region added in a source contact section of a cell unit. Further specific description will be made as follows.

The MOSFET 100 includes: a semiconductor layer 101 having a first conductivity type (n-type) provided in a semiconductor substrate (not shown); a first base region (p-type base region 105) provided in a surface portion of the semiconductor layer and having a second conductivity type, which is inverse to the first conductivity type; a gate electrode (polysilicon (polycrystalline silicon) film 104) embedded in a trenched portion (gate trench 102) provided in the p-type base region 105; a first source region (n+ type source region 106) having the first conductivity type provided in the lateral side of the polysilicon film 104 and provided in a surface portion of p-type base region 105; a second source region (higher concentration source region 121) having the first conductivity type provided in both the surface portion of the p-type base region 105 and a surface portion of the n+ type source region 106 so as to spaced away from the gate trench 102, and is shallower than the n+ source region 106; and a source electrode 112 provided above the semiconductor layer 101 and coupled to the higher concentration source region 121. In the present embodiment, the semiconductor layer 101 corresponds to the n-type layer. In addition, the semiconductor layer 101 may be a silicon layer, for example.

In the MOSFET 100, the n+ type source region 106 having a relatively higher concentration of an n-type impurity is provided in a predetermined location in the surface portion of the p-type base region 105, and the higher concentration source region 121 having a relatively lower concentration portion of an n-type impurity and a relatively higher concentration portion of an n-type impurity is provided so as to be in contact with the n+ type source region 106.

The n+ type source region 106 is provided so as to be in contact with a side surface of the gate trench 102. In addition, the higher concentration source region 121 is provided to overlap the n+ type source region 106 and the p-type base region 105, and the concentration of n-type impurity in the higher concentration source region 121 is partially higher in the region overlapping with the n+ type source region 106 than that of the n+ type source region 106, and is also partially higher in the region overlapping with the p-type base region 105 than the concentration of p-type impurity in the p-type base region 105.

In addition, a second base region (p+ type base region 109) containing an impurity of p type conductivity at higher concentration than in the p-type base region 105 is provided at a location remote from the n+ type source region 106 and further from the gate trench 102 than the n+ type source region 106 in the surface portion of the p-type base region 105. The higher concentration source region 121 is provided from an upper portion of the n+ type source region 106 over the edge in the side of the gate electrode in the p+ type base region 109.

In addition, the gate oxide film 103 is formed on an interior wall of the gate trench 102, and the polysilicon film 104 is provided so as to be in contact with the gate oxide film 103. The region for forming the polysilicon film 104 and a vicinity thereof are provided with an interlayer insulating film 107 that covers an upper portion of the polysilicon film 104. The n+ type source region 106 is provided to extend toward a direction further from the gate trench 102 than the side surface of the interlayer insulating film 107. In addition, a drain electrode 123 is provided so as to be in contact with a back surface of the semiconductor layer 101. In addition, the gate trench 102 defines the p-type base region 105.

Next, the method for manufacturing the MOSFET 100 will be described. The method contains the following process operations.

Step 11: forming the first base region having the second conductivity type (p-type base region 105) is formed in the layer (semiconductor layer 101) having the first conductivity type (n-type);

Step 12: forming the first source region having n-type conductivity (n+ type source region 106) is formed in the surface portion of the p-type base region 105;

Step 13: forming the second source region of n-type conductivity (higher concentration source region 121) overlapping with the n+ type source region 106 and the surface of the p-type base region 105; and Step 14: forming the source electrode 112 coupled to the higher concentration source region 121 is formed over the semiconductor layer 101.

Each of the process steps will be more specifically described as follows in reference to FIGS. 3A and 3B, FIGS. 4A and 4B and FIGS. 5A and 5B. FIGS. 3A and 3B, FIGS. 4A and 4B and FIGS. 5A and 5B are cross-sectional views of a cell unit of a source-two dimensional-contact structure in an n-channel vertical MOSFET, illustrating a process for manufacturing the MOSFET 100.

Figure 3A:
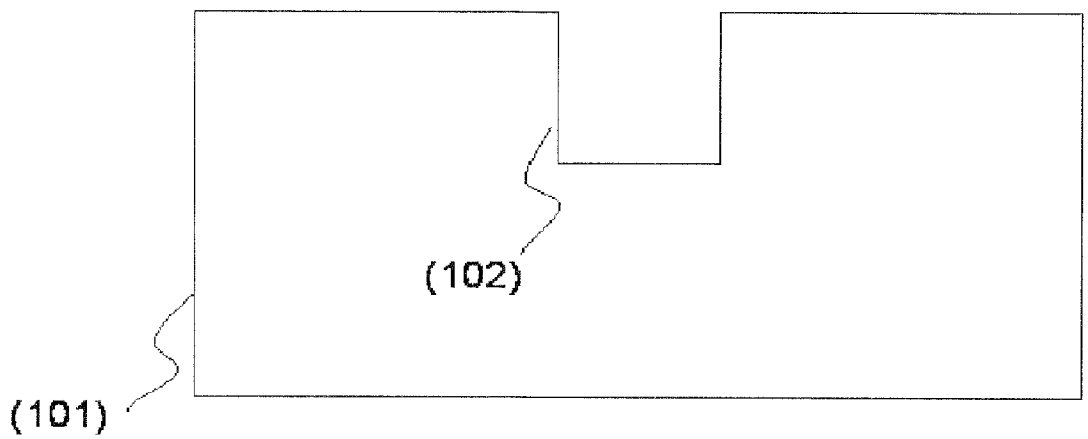
FIGS. 3A and 3B are cross-sectional views, illustrating the manufacturing process for the transistor shown in FIG. 1.

First of all, predetermined locations in the n-type semiconductor layer 101 are selectively removed by employing a photolithographic technology and an etching technology to form a gate trench 102 in the semiconductor layer 101. In such configuration, the gate trench 102 may be designed to have a dimension of, for example, a width of about 0.25 to 0.5 fÊm, and a depth of about 0.8 to 1.2 fÊm (FIG. 3A). In addition, in the present embodiment, the gate trench 102 that defines the p-type base region 105 is formed in the process for forming the gate trench 102.

Figure 3B:
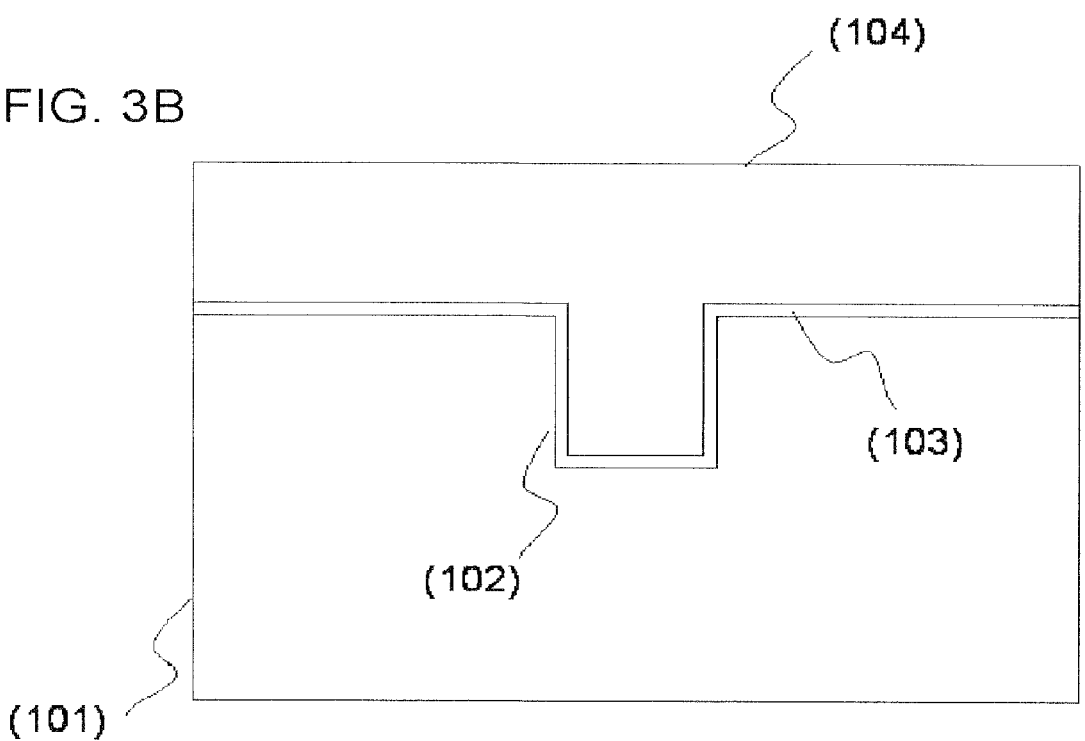
Figure 4A:
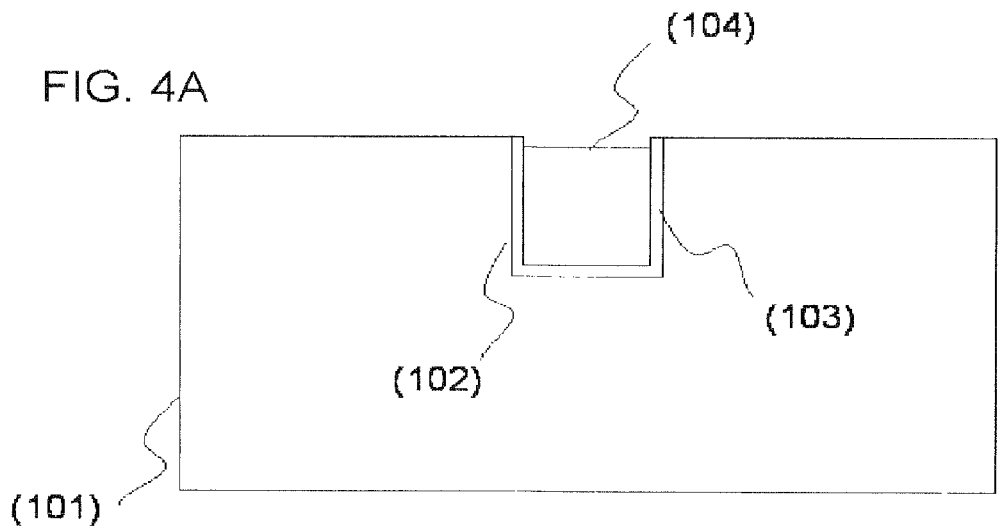
FIGS. 4A and 4B are cross-sectional views, illustrating the manufacturing process for the transistor shown in FIG. 1.

Subsequently, the gate oxide film 103 that covers an interior wall of the gate trench 102 is formed on the entire surface of semiconductor layer 101 via a thermal oxidation process. The thickness of the gate oxide film 103 may be, for example, around 300 to 700 angstroms. Next, an electrically conducting film (polysilicon film 104) for the gate electrode is formed on the entire upper surface of the semiconductor layer 101 having the gate oxide film 103 formed thereon via a CVD process so as to plug the gate trench 102 (FIG. 3B). The thickness of the polysilicon film 104 may be, for example, around 6,000 to 10,000 A angstroms. Then, the polysilicon 104 is etched so as to partially leave the polysilicon film 104 only in the gate trench 102. The portion of the polysilicon film 104 formed outside of the gate trench 102 is removed via the etching process to form the gate electrode in the gate trench 102 (FIG. 4A).

Next, a p-type impurity is injected into the semiconductor layer 101 having the gate trench 102 formed therein to form a p-type base region 105 for forming an active cell (step 11). The p-type base region 105 is, more specifically, formed via an ion implantation of boron and the subsequent thermal processing. Process conditions for the ion implantation process in this case are, for example, injection dose level of $8 \times 10^{12}$ cm$^{-2}$ and accelerating energy of 120 keV, and process conditions for the thermal processing are, for example, thermal processing temperature of 1,000 degree C. and processing time of about 30 to 90 minutes. Here, the ion implantation is conducted in the region defined with the gate trench 102 to form the p-type base region 105 in the above-described defined area.

Next, a mask (not shown) having openings that serve as regions for forming p+ type base regions 109 is formed in the p-type base region 105 via a patterning process of a photolithographic technology, and then an ion implantation of BF$_2$ (boron difluoride) and a thermal processing are conducted for the p-type base region 105 through the openings to selectively form the P+ type base regions 109 in predetermined locations in the surface portion of the p-type base region 105. Process conditions for the ion implantation process in this case are injection dose level of $5 \times 10^{15}$ cm$^{-2}$ and accelerating energy of 70 keV, and process conditions for the thermal processing are thermal processing temperature of 1,000 degree C. and processing time of about 30 to 60 minutes.

Figure 4B:
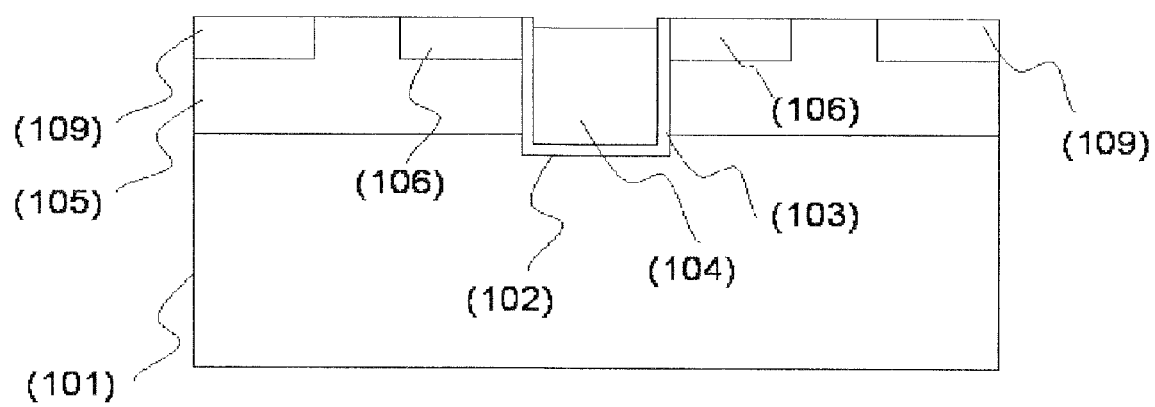

Then, arsenic is injected into surface portions of the p-type base region 105 to form the n+ type source region 106 that is in contact with the side surface of the gate trench 102 (step 12). More specifically, a mask (not shown) having openings that serve as regions for forming n+ type source regions 106 is formed in the p-type base region 105 via a patterning process of a photolithographic technology, and then an ion implantation of arsenic into the p-type base region 105 and the subsequent thermal processing are conducted through the opening to selectively form the n+ type source regions 106 in predetermined locations in the surface portion of the p-type base region 105. Process conditions for the ion implantation process in this case are, for example, injection dose level of $2 \times 10^{15}$ cm$^{-2}$ and accelerating energy of 70 keV, and process conditions for the thermal processing are, for example, thermal processing temperature of 850 degree C. and processing time of about 30 to 50 minutes (FIG. 4B).

Figure 5A:
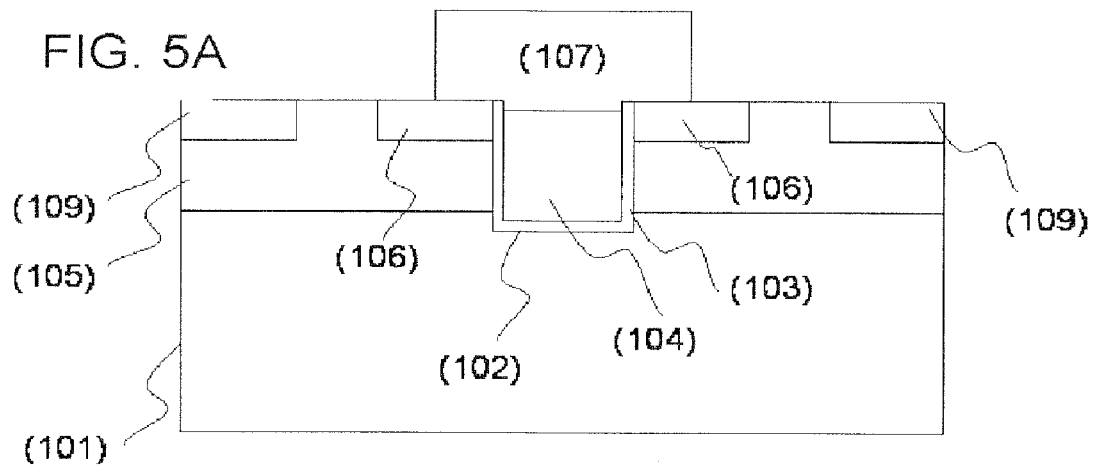
FIGS. 5A and 5B are cross-sectional views, illustrating the manufacturing process for the transistor shown in FIG. 1.

Then, the CVD process is conducted over the entire upper surface of the semiconductor layer 101 to form a boro-phospho silicate glass (BPSG) film having a thickness of about 8,000 to 10,000 angstrom, which will serve as the interlayer insulating film 107, and then the BPSG film is selectively etched by employing a photolithographic technology to form the interlayer insulating film 107 that covers over the polysilicon film 104 (FIG. 5A). FIG. 5A illustrates a condition, where no misalignment between the interlayer insulating film 107 and the polysilicon film 104 is caused. In addition, the interlayer insulating film 107 is formed to have a larger width than the polysilicon film 104, and when no misalignment is caused therebetween, the interlayer insulating film 107 covers the top of the polysilicon film 104 and extends from the polysilicon film 104 toward the lateral side.

Next, an operation for forming the higher concentration source region 121 in step 13 is conducted. In the present embodiment, the higher concentration source region 121, which is overlapped with a portion of the n+ type source region 106, is formed by injecting an impurity having n+ type conductivity through a mask of the interlayer insulating film 107 from a location in the surface portion of the p-type base region 105 over a location in the surface portion of the n+ type source region 106.

Figure 5B:
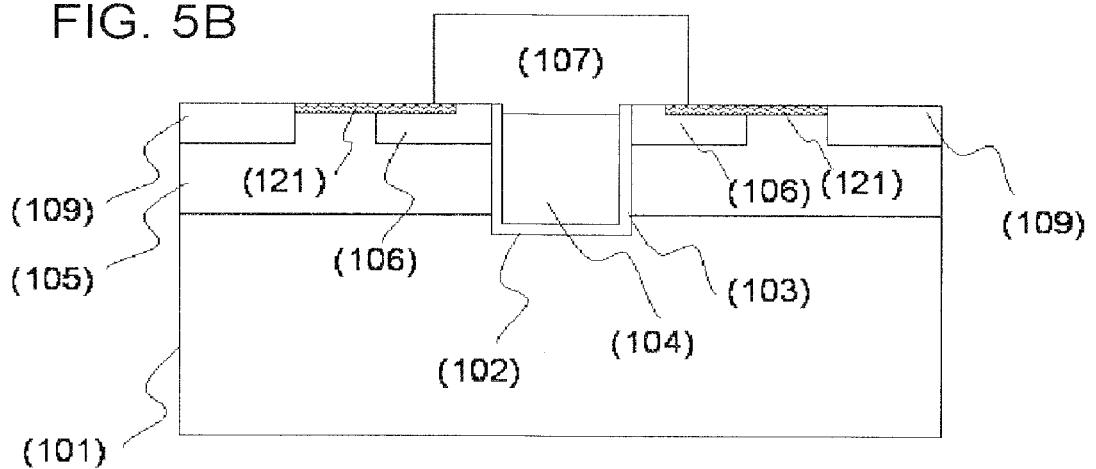
Figure 6:
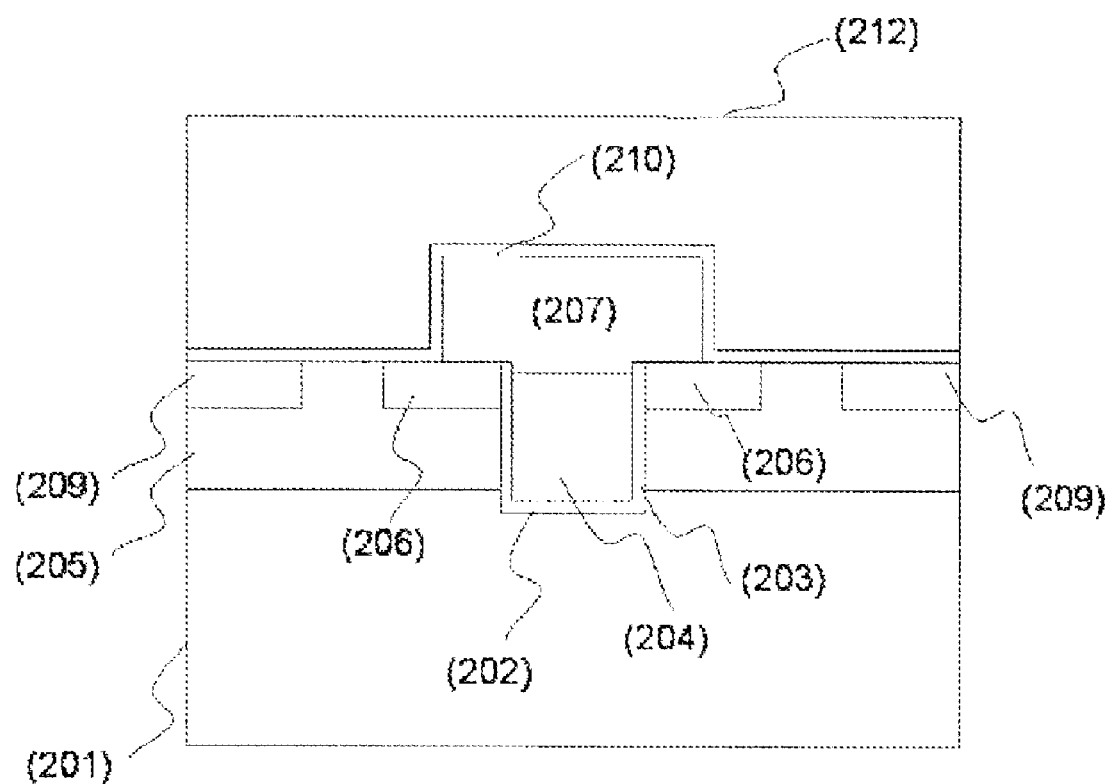
FIG. 6 is a cross-sectional view, showing a configuration of a transistor of a related art.
Figure 7:
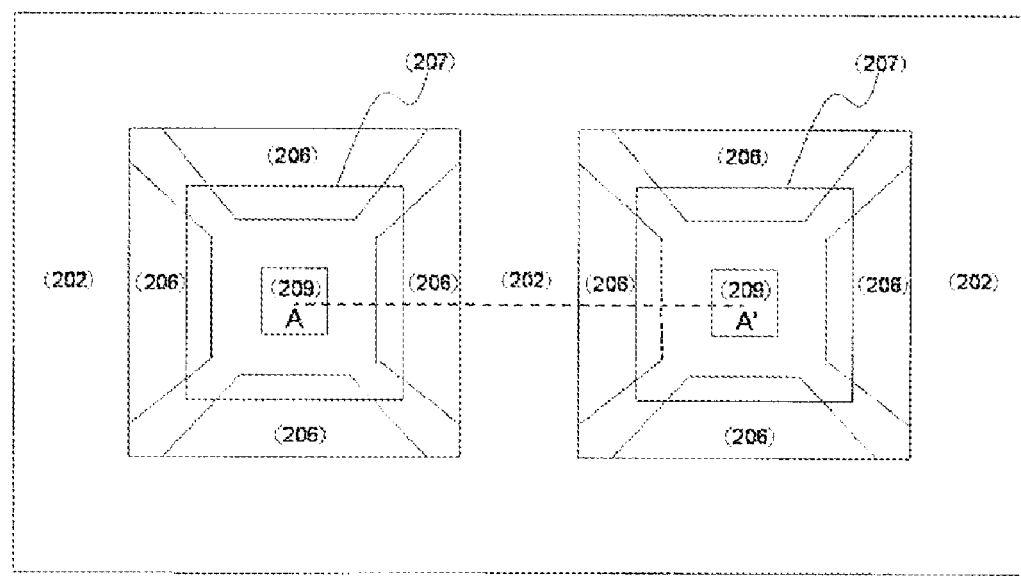
FIG. 7 is a plan view, showing the configuration of the transistor of the related art.
Figure 8A:
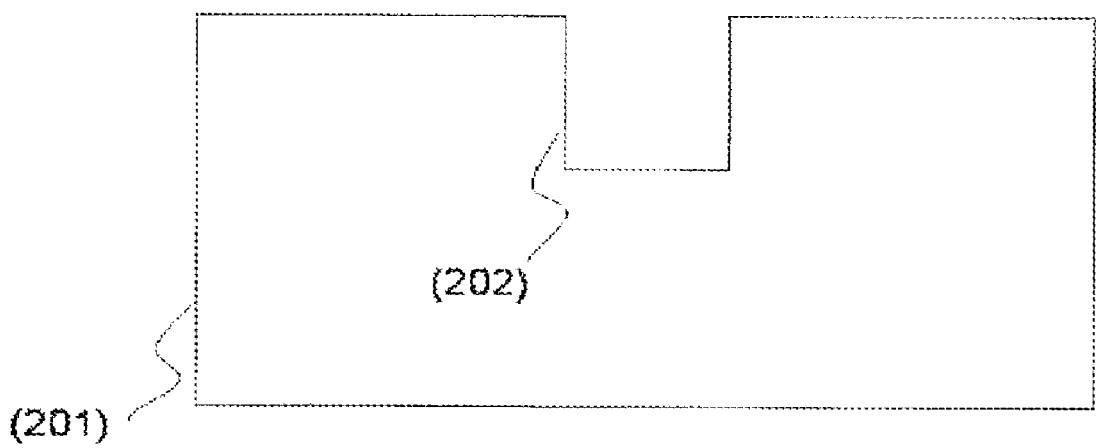
FIGS. 8A and 8B are cross-sectional views, illustrating the manufacturing process for the transistor shown in FIG. 6.
Figure 8B:
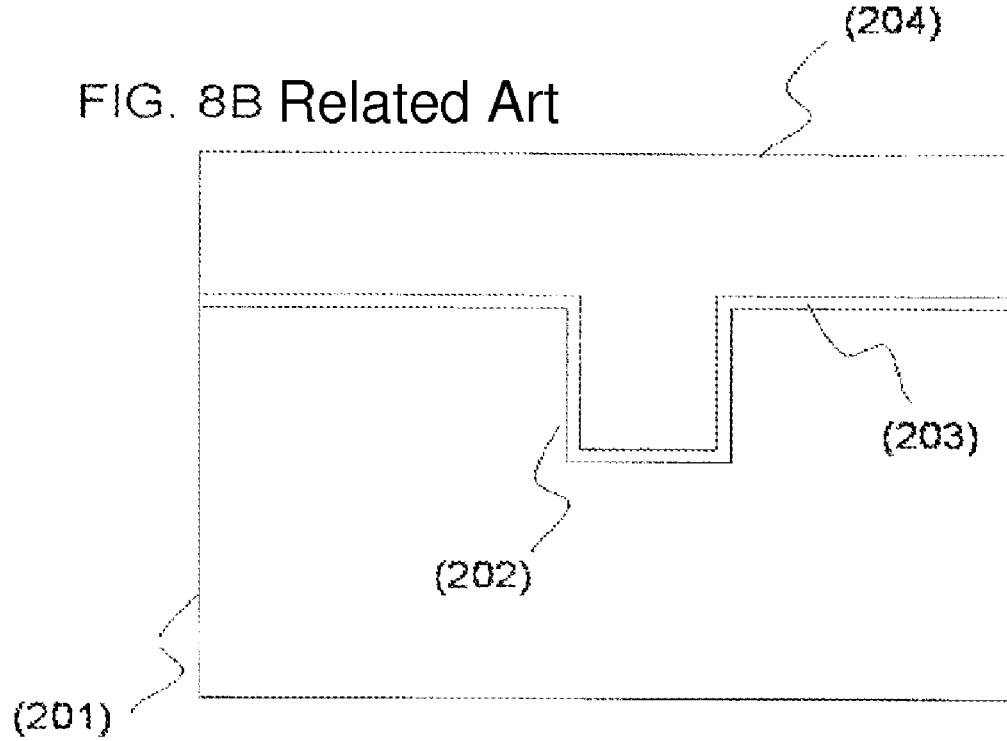
Figure 9A:
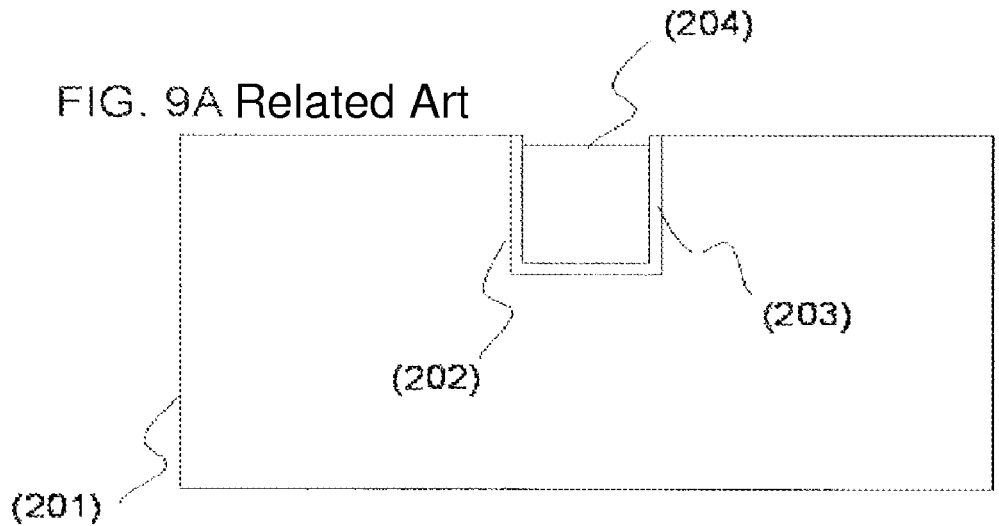
FIGS. 9A and 9B are cross-sectional views, illustrating the manufacturing process for the transistor shown in FIG. 6.
Figure 9B:
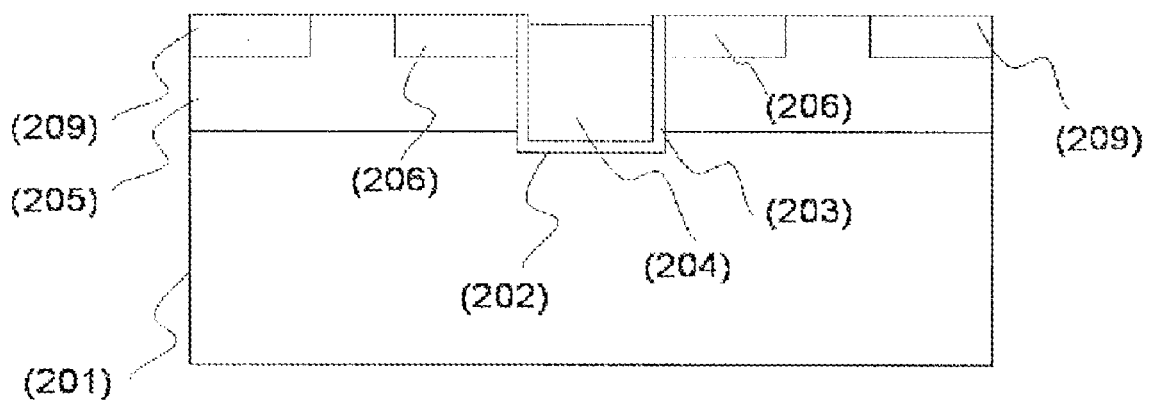
Figure 10:
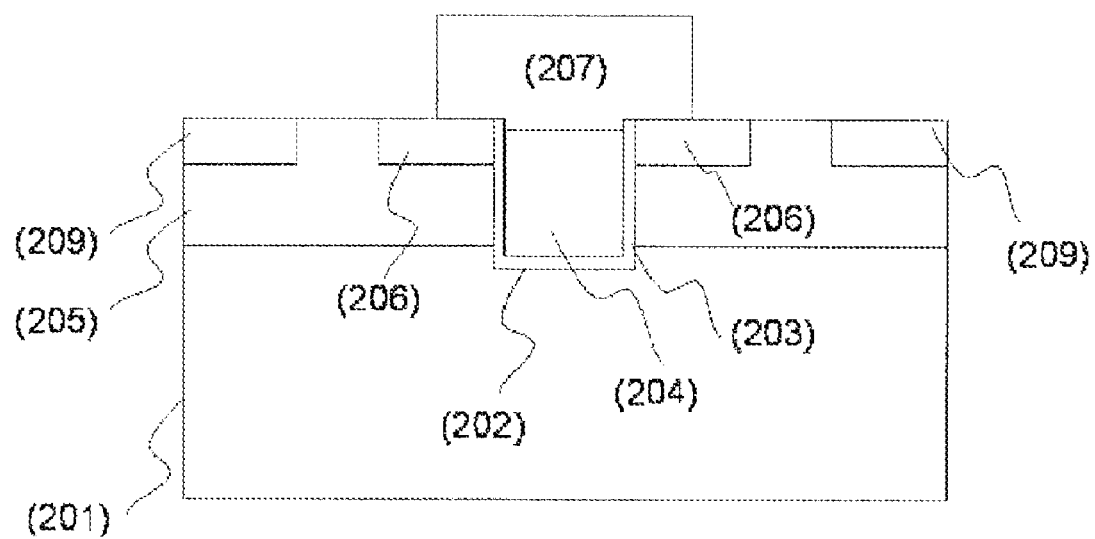
FIG. 10 is cross-sectional view, illustrating the manufacturing process for the transistor shown in FIG. 6.

More specifically, an oblique-rotating injection process is conducted to inject arsenic, which is an ion species having the same conductivity type as that of the n+ type source region 106, in the surface portion of the p-type base region 105 through the openings in the interlayer insulating film 107, so that the higher concentration source region 121 which is shallower than the n+ type source region 106 is formed (FIG. 5B). In this case, the higher concentration source region 121 is formed to extend from the upper portion of the p-type base region 105 over the edge in the side of the gate electrode in the p+ type base region 109. Process conditions for the oblique-rotating injection process are, for example, injection dose level of $1 \times 10^{15}$ cm$^{-2}$ and accelerating energy of 30 keV, and the angle of the oblique is, for example, about 45 degrees over a principal surface of the semiconductor layer 101. In addition, a thermal processing may also be conducted after the ion implantation process. Here, the configuration shown in FIG. 5B illustrates an exemplary implementation; in which the higher concentration source region 121 is formed over the gate electrode side of the n+ type source region 106 by conducting the oblique injection, rather than in the side edge of the interlayer insulating film 107.

Here, the dose level of arsenic is set to be a lower dose level that does not neutralize the conductivity in the p+base region 109. More specifically, the injected impurity concentration of n-type impurity injected into the p-type base region 105 in the process for forming the higher concentration source region 121 is higher than the injected impurity concentration of p-type impurity injected into the semiconductor layer 101 in the process for forming the p-type base region 105, and is lower than the injection level injected impurity concentration of p-type impurity injected into the semiconductor layer 101 in the process for forming the p+ type base region 109. Thus, it is not necessary to provide a mask to cover the upper portion of the p+ type base region 109 for forming the higher concentration source region 121, so that simplified manufacturing process can be achieved. Thus the higher concentration source region 121 is formed to have a relatively lower concentration portion of an n-type impurity overlapping with the P+ type base region 109 and a relatively higher concentration portion of an n-type impurity overlapping with the n+ type source region 106.

Next, a barrier metal film 110 is formed on the surface via a sputter process, and subsequently aluminum, for example, is sputtered on the surface to form the source electrode 112. The thickness of the source electrode 112 is, for example, about 4 to 6 fÊm (step 14, FIG. 1). In addition, the drain electrode 123 is formed in the back surface of the semiconductor layer 101. The power MOSFET shown in FIG. 1 is thus obtained by the above-mentioned procedure.

Advantageous effects obtainable by employing the configuration of the present embodiment will be described as follows.

The present embodiment is configured that the higher concentration source region 121 is additionally included in the peripheral section of the source contact in the cell unit of the MOSFET 100. The higher concentration-source layer is additionally included in the peripheral section of the contact, which has no source region in the technology of the related art (see the gap between the right n+ type source region 206 and the barrier metal film 210 of FIG. 11), so that an improved contact-ability of the source, or in other words an improved coupling stability between the source region and the source electrode 112 can be achieved. In addition, an improvement in the coupling stability results in an improved on-resistance property for the MOSFET 100.

Figure 11:
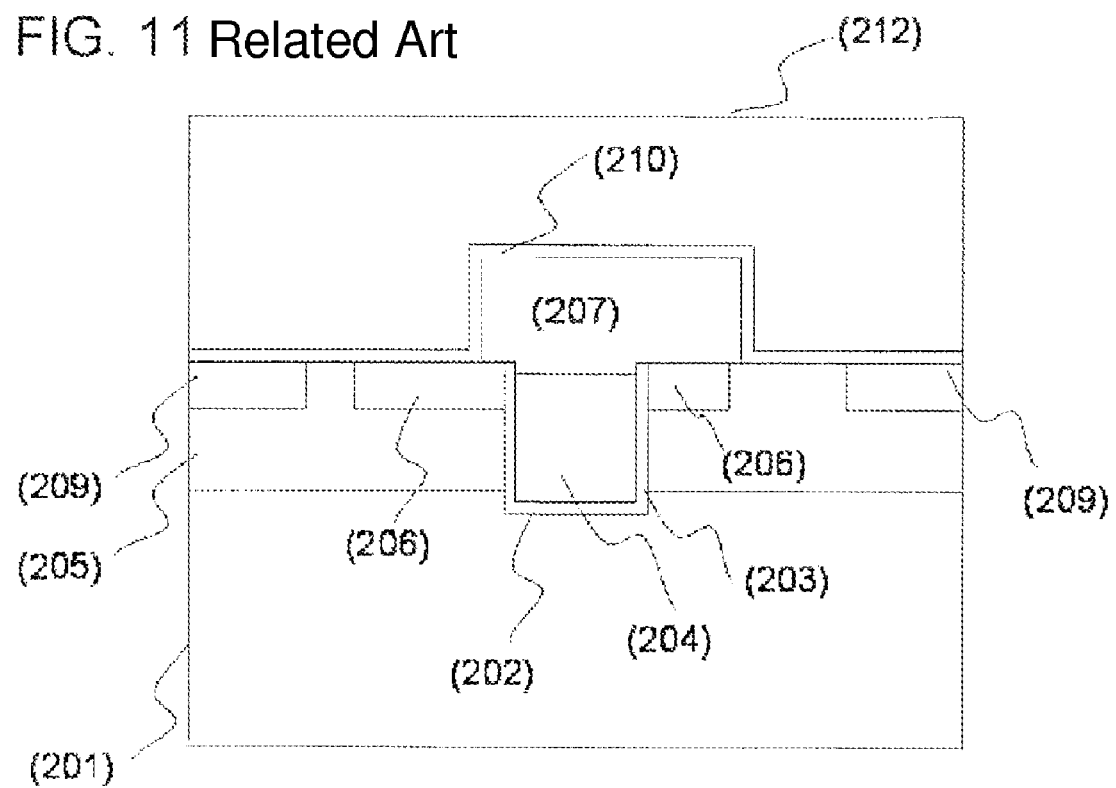
FIG. 11 is cross-sectional view, illustrating the manufacturing process for the transistor shown in FIG. 6.

Even if a misalignment shown in FIG. 11, for example, is caused in the operation of forming the interlayer insulating film 107 in the process for forming the MOSFET 100, sufficiently larger dimension of the contacting area between the higher concentration source region 121 and the source electrode 112 can be ensured by providing the higher concentration source region 121 extending from the side edge of the n+ type source region 106, thereby effectively inhibiting an increase in the coupling resistance.

While a dimension of the region for forming the higher concentration source region 121 and a tolerance in a misalignment of the interlayer insulating film 107 depends upon the conditions in the process for forming the higher concentration source region 121, when, for example, an oblique-rotating injection process at 45 degrees and a thermal treatment are conducted under the above-described conditions, the higher concentration source region 121, which can ensure a sufficient on-resistance property even if a misalignment is caused to overlap the side edge of the interlayer insulating film 107 with the side edge of the p+ type base region in the n+ type source region 106, can be formed to extend from the surface portion of the n+ type source region 106 over the lateral side thereof.

In addition, since a concentration of n-type impurity in the surface portion for coupling the source electrode 112 therewith can be enhanced by forming the higher concentration source region 121 so as to overlap the n+ type source region 106, the coupling resistance between the source electrode 112 and the n+ type source region 106 can be reduced.

In the MOSFET 100, only the contact peripheral section includes the additional source region of higher impurity concentration, and the condition of the finished diffusion layer in the channel section is substantially not changed. In addition, in the MOSFET 100, the higher concentration source region 121 is formed at a location that is shallower than the n+ type source region 106. Furthermore, a silicide layer may be formed on the higher concentration source region 121 which is capable of providing a more reduced coupling resistance.

While embodiments of the present invention has been fully described in reference to the annexed figures, it is intended to present these embodiments for the purpose of illustrations of the present invention only, and various modifications thereof are available.

For example, while the exemplary implementation related to the vertical n-channel MOSFET has been described in the above-described embodiment, the channel type of the transistor may be alternatively p-type. On the other hand, while a two-dimensional pattern composed of regularly-arranged plurality of rectangular-shaped unit cells has been illustrated in FIG. 2, geometry was exemplified, two-dimensional pattern in the vertical MOSFET is not limited thereto.

In addition, while the configuration, in which the layer having the first conductivity type is the semiconductor layer 101, has been illustrated in the above-described embodiment, such layer may alternatively be a layer that is formed by injecting an impurity into the semiconductor substrate, or a layer that is formed by being grown from the principal surface of the semiconductor substrate. For example, the layer of the first conductivity type may alternatively be an n-layer, which is epitaxially grown on an n+ type semiconductor substrate.

In addition, while the process of forming the higher concentration source region 121 after forming the n+ type source region 106 has been illustrated in the above-described embodiment, any of the n+ type source region 106 or the higher concentration source region 121 may be formed first. The higher concentration source region 121 is formed after forming the n+ type source region 106, so that the higher concentration source region 121 which is shallower than the n+ type source region 106 can be further stably formed in a predetermined depth in the surface portion of the p-type base region 105.

While the configuration provided with the higher concentration source region 121 in the entire surface region extending from the gate side edge of the p+ type base region 109 to a surface portion of the n+ type source region 106 which is overlapped with the interlayer insulating film 107 has been illustrated in the above-described embodiment, the higher concentration source region 121 may at least be a region between the gate electrode side edge of the p+ type base region 109 and the p+ type base region side edge of the n+ type source region 106. By providing higher concentration source region 121 between the p+ type base region 109 and the n+ type source region 106, the coupling stability between the source electrode 112 and the n+ type source region 106 can be further improved. In addition, the production yield of the MOSFET 100 can be further improved.

In addition, while no particular limitation exists in the applications for the vertical MOSFET in the above-mentioned embodiment, the typical application may be a power application such as a high power switching and the like.

It is apparent that the present invention is not limited to the above embodiment, and may be modified and changed without departing from the scope and spirit of the invention.

What is claimed is:

1. A method for manufacturing a transistor, comprising:
    forming, in a semiconductor layer having a first conductivity type, a base region having a second conductivity type;

forming a first source region having the first conductivity type in said base region;

forming a second source region having the first conductivity type in said base region, wherein said second source region is in contact with said first source region and an impurity concentration of said second source region is different from an impurity concentration of said first source region; and forming a source electrode coupled to both said second source region and said base region.

2. The method for manufacturing a transistor as set forth in claim 1, wherein said forming the second source region includes forming said second source region so as to be overlapped with a portion of said first source region by injecting an impurity by an oblique-rotating injection.

3. The method for manufacturing a transistor as set forth in claim 1, further comprising:

selectively removing a predetermined location of said semiconductor layer to form a trenched portion;

forming a gate insulating film and a gate electrode in said trenched portion; and forming an interlayer insulating film to cover an upper portion of said gate electrode.

4. The method for manufacturing a transistor as set forth in claim 3, wherein said base region is a first base region and the method further comprises forming a second base region in the surface portion of said first base region, at a location remote from said first source region, wherein said second base region contains the impurity of the second conductivity type at higher concentration than both in said first base region and in said second source region.

5. The method for manufacturing a transistor as set forth in claim 3, wherein said forming said base region includes injecting an impurity of the second conductivity type into said layer having the first conductivity type with said trenched portion formed therein to form said base region, wherein said forming the first source region includes injecting an impurity of the first conductivity type into the lateral side of said gate electrode in said base region to form said first source region that is in contact with a side surface of said trenched portion, and wherein said forming the second source region by injecting an impurity having the first conductivity type uses said interlayer insulating film as a mask.

6. The method for manufacturing a transistor as set forth in claim 1, wherein the impurity concentration of said second source region is greater than the impurity concentration of said first source region.

7. The method for manufacturing a transistor as set forth in claim 6, wherein said forming the second source region includes forming said second source region so as to be overlapped with a portion of said first source region by injecting an impurity by an oblique-rotating injection.

8. A transistor device, comprising:

a semiconductor layer having a first conductivity type;

a base region having a second conductivity type provided in a surface portion of said semiconductor layer, wherein the second conductivity type is inverse to the first conductivity type;

a gate electrode formed in a trenched portion that is provided in said base region;

a first source region having the first conductivity type provided in the lateral side of said gate electrode and provided in a surface portion of said base region;

a second source region having the first conductivity type provided in the surface portion of said base region and in contact with said first source region, an impurity concentration of said second source region is different from an impurity concentration of said first source region; and a source electrode coupled to said second source region and said base region.

9. The device as set forth in claim 8, wherein the impurity concentration of said second source region is greater than the impurity concentration of said first source region.

10. The device as set forth in claim 9, wherein said second source region is overlapped with a portion of said first source region.

11. The device as set forth in claim 8, wherein said second source region is overlapped with a portion of said first source region.

12. A method for manufacturing a transistor, comprising:

forming, in a semiconductor layer having a first conductivity type, a base region having a second conductivity type;

forming a first source region having the first conductivity type in said base region;

forming a second source region having the first conductivity type in said base region, wherein said second source region is in contact with said first source region; and forming a source electrode coupled to both said second source region and said base region, wherein said forming the second source region includes forming said second source region so as to be overlapped with a portion of said first source region by injecting an impurity by an oblique-rotating injection.

13. The method for manufacturing a transistor as set forth in claim 12, wherein an impurity concentration of said second source region is different from an impurity concentration of said first source region.

14. The method for manufacturing a transistor as set forth in claim 13, wherein the impurity concentration of said second source region is greater than the impurity concentration of said first source region.

* * * * *